(12) United States Patent
Kamata et al.

(10) Patent No.: US 9,103,894 B2
(45) Date of Patent: Aug. 11, 2015

(54) BATTERY-MONITORING DEVICE

(71) Applicant: KEIHIN CORPORATION, Tokyo (JP)

(72) Inventors: Seiji Kamata, Tochigi-ken (JP);
Hidefumi Abe, Tochigi-ken (JP)

(73) Assignee: KEIHIN CORPORATION (JP)

( * ) Notice: Subject to any disclaimer, the term of this patent is extended or adjusted under 35 U.S.C. 154(b) by 325 days.

(21) Appl. No.: 13/632,385

(22) Filed: Oct. 1, 2012

(65) Prior Publication Data

US 2013/0088236 A1     Apr. 11, 2013

(30) Foreign Application Priority Data

Oct. 7, 2011   (JP) ................................. 2011-222859

(51) Int. Cl.
*H02J 7/00*     (2006.01)
*G01R 31/36*    (2006.01)
*G01R 19/165*   (2006.01)

(52) U.S. Cl.
CPC ...... *G01R 31/3658* (2013.01); *G01R 19/16542* (2013.01); *G01R 31/362* (2013.01)

(58) Field of Classification Search
USPC .................................................. 320/134–136
See application file for complete search history.

(56) References Cited

U.S. PATENT DOCUMENTS 6,172,485 B1 *   1/2001  Fujita et al. .................... 320/136
2011/0156714 A1 *  6/2011  Mizoguchi et al. ........... 324/434

FOREIGN PATENT DOCUMENTS

| JP | 2008-141954 A | 6/2008 |
| JP | 2011134577 A | 7/2011 |
| WO | 2011111350 A1 | 9/2011 |

OTHER PUBLICATIONS

Japanese Notice of Reasons for Rejection corresponding to Application Number: 2011-222859; Date of Mailing: Feb. 3, 2015, with English translation.

* cited by examiner

*Primary Examiner* — Samuel Berhanu
(74) *Attorney, Agent, or Firm* — Cantor Colburn LLP

(57) ABSTRACT

A battery-monitoring device that monitors a state of charge of each battery cell constituting a battery is provided, including: a voltage detection circuit that individually detects a voltage of the battery cell; a voltage comparison circuit that individually compares the voltage of the battery cell and a threshold voltage, and outputs a signal having a first level when the voltage of the battery cell is equal to or greater than the threshold voltage, and a signal having a second level when the voltage of the battery cell is less than the threshold voltage; and a determination unit that determines the overcharged state of the battery cell when at least one condition is satisfied from among two conditions of: a voltage detection value which is input from the voltage detection circuit being equal to or greater than a threshold; and a signal which is input from the voltage comparison circuit being a first level.

2 Claims, 4 Drawing Sheets

BATTERY-MONITORING DEVICE

BACKGROUND OF THE INVENTION

1. Field of the Invention

The present invention relates to a battery-monitoring device.

Priority is claimed on Japanese Patent Application No. 2011-222859, filed on Oct. 7, 2011, the content of which is incorporated herein by reference.

2. Description of Related Art

As is well known, a motor which is used as a source of power, and a high voltage and capacity battery that supplies power to the motor are mounted to vehicles such as an electric automobile and a hybrid automobile. The high-voltage battery is configured such that a plurality of battery cells formed of a lithium-ion-battery, a nickel-hydrogen battery or the like are connected to each other in series.

In the related art, a voltage of each battery cell constituting the above-mentioned high-voltage battery is detected using a voltage detection circuit (for example, a dedicated IC chip), and the presence or absence of battery cells which are in an overcharged state is monitored. However, when the voltage detection circuit is out of order, the voltage of the battery cell cannot be accurately detected (voltage is detected as being low), and thus there is a concern that the presence of overcharged cells may fail to be noticed.

For this reason, a technique has been developed which prevents an overcharged cell from failing to be noticed by using a voltage detection result of the other voltage detection circuit even when one voltage detection circuit is out of order through the duplication of the voltage detection circuit (see Japanese Unexamined Patent Application, First Publication No. 2008-141954).

However, in the above-mentioned related art, since duplication of the voltage detection circuit such as, for example, a dedicated IC chip is required, there is a problem in that an increase in component costs, mounting space, and current consumption is caused.

The invention is contrived in view of such circumstances, and an object thereof is to provide a battery-monitoring device which is capable of preventing overcharged cells due to circuit failure from failing to be noticed while suppressing an increase in component costs, mounting space, and current consumption.

SUMMARY OF THE INVENTION

The present invention employs the following configuration to solve the above problems.

(1) According to a first aspect of the invention, a battery-monitoring device is provided that monitors a state of charge of each battery cell constituting a battery, including: a voltage detection circuit that individually detects a voltage of the battery cell; a voltage comparison circuit that individually compares the voltage of the battery cell and a threshold voltage, and outputs a signal having a first level when the voltage of the battery cell is equal to or greater than the threshold voltage, and a signal having a second level when the voltage of the battery cell is less than the threshold voltage; and a determination unit that determines the overcharged state of the battery cell when at least one condition is satisfied from among two conditions of: a voltage detection value which is input from the voltage detection circuit being equal to or greater than a threshold; and a signal which is input from the voltage comparison circuit being a first level.

(2) In the battery-monitoring device according to the above (1), as a separate process from a process of confirming whether each of the two conditions is satisfied, the determination unit may determine whether the battery cell is in an overcharged state by determining only whether the signal which is input from the voltage comparison circuit is a first level.

(3) In the battery-monitoring device according to the above (2), when the voltage detection value which is input from the voltage detection circuit is equal to or greater than a threshold, and the signal which is input from the voltage comparison circuit is a second level, the determination unit may determine that the battery cell is in an overcharged state, and may determine that the voltage comparison circuit is out of order.

(4) In the battery-monitoring device according to the above (2), when the voltage detection value which is input from the voltage detection circuit is less than a threshold, and the signal which is input from the voltage comparison circuit is a first level, the determination unit may determine that the battery cell is in an overcharged state, and may determine that the voltage detection circuit is out of order.

(5) In the battery-monitoring device according to the above (1), when the voltage detection value which is input from the voltage detection circuit is equal to or greater than a threshold, and the signal which is input from the voltage comparison circuit is a second level, the determination unit may determine that the battery cell is in an overcharged state, and may determine that the voltage comparison circuit is out of order.

(6) In the battery-monitoring device according to the above (1), when the voltage detection value which is input from the voltage detection circuit is less than a threshold, and the signal which is input from the voltage comparison circuit is a first level, the determination unit may determine that the battery cell is in an overcharged state, and may determine that the voltage detection circuit is out of order.

DETAILED DESCRIPTION OF THE INVENTION

Hereinafter, an embodiment of the invention will be described with reference to the accompanying drawings.

Figure 1:
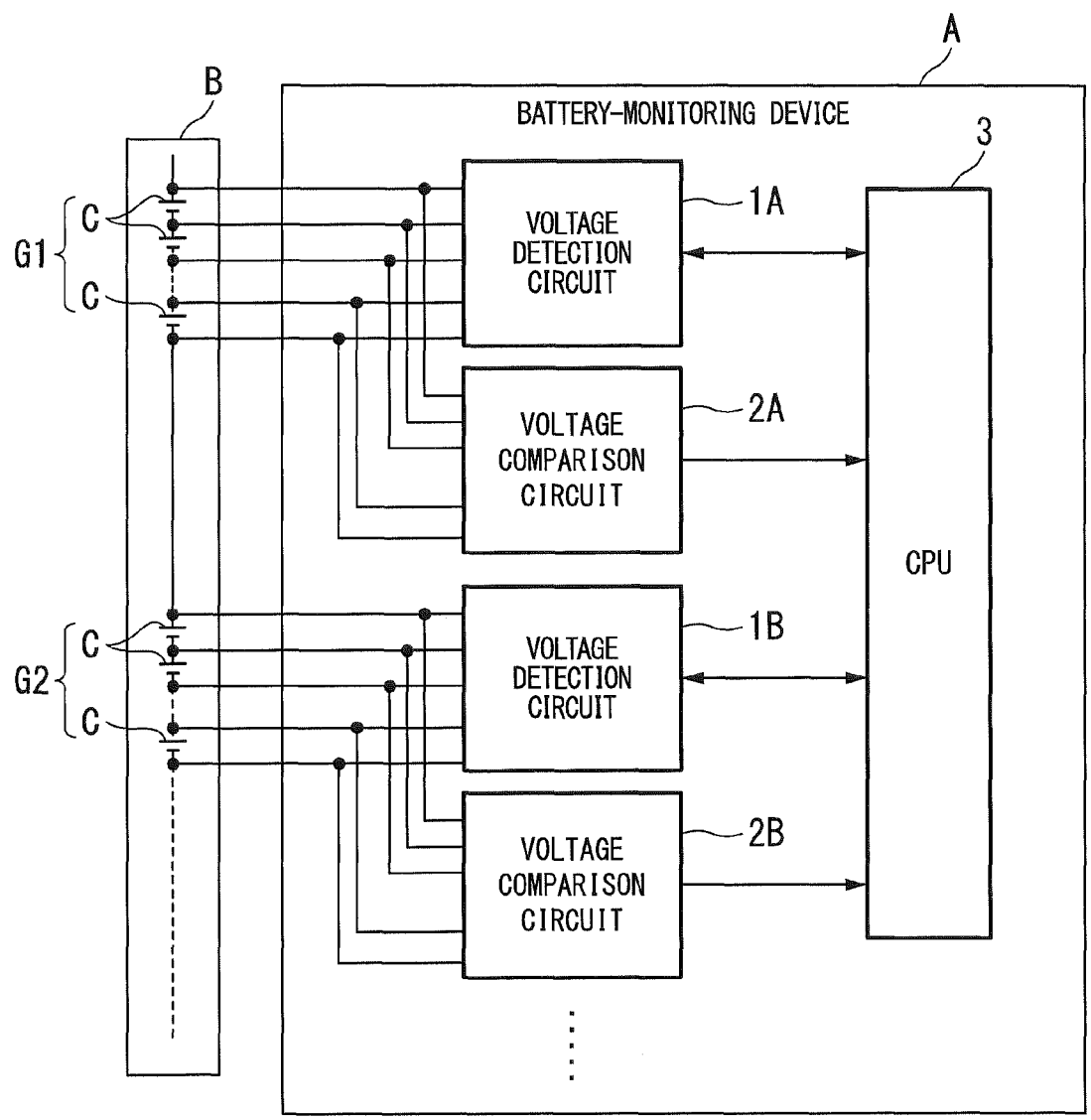
FIG. 1 is a schematic configuration diagram illustrating a battery-monitoring device A according to the present embodiment.

FIG. 1 is a schematic configuration diagram illustrating a battery-monitoring device A according to the present embodiment. The battery-monitoring device A is used for monitoring the state of charge of each battery cell C constituting a battery B, and includes voltage detection circuits 1A and 1B, voltage comparison circuits 2A and 2B, and a CPU (Central Processing Unit) 3, as shown in FIG. 1.

Each battery cell C constituting the battery B is divided into groups by plural units, and the voltage detection circuit 1A individually detects a voltage Vcell of the battery cell C belonging to a group G1 and outputs a voltage detection value Vca thereof to the CPU 3. In addition, the voltage detection circuit 1B individually detects the voltage Vcell of the battery cell C belonging to a group G2 and outputs a voltage detection value Vcb thereof to the CPU 3. The voltage detection circuits 1A and 1B are dedicated IC chips having an A/D conversion function, a communication function with the CPU 3, and the like.

Meanwhile, for convenience of description, FIG. 1 shows a state in which the battery-monitoring device A is provided with two voltage detection circuits 1A and 1B, but the number of voltage detection circuits may be appropriately changed in accordance with the total number of battery cells C constituting the battery B (that is, in accordance with the number of groups of the battery cell C).

The voltage comparison circuit 2A individually compares a voltage of the battery cell C belonging to the group G1 with a threshold voltage Vth2, and outputs, to the CPU 3, a signal having a first level (for example, high level) when the voltage Vcell of the battery cell C is equal to or greater than the threshold voltage Vth2, and a signal having a second level (for example, low level) when the voltage Vcell of the battery cell C is less than the threshold voltage Vth2. The voltage comparison circuit 2B individually compares the voltage Vcell of the battery cell C belonging to the group G2 with the threshold voltage Vth2, and outputs, to the CPU 3 a signal having a high level when the voltage Vcell of the battery cell C is equal to or greater than the threshold voltage Vth2, and a signal having a low level when the voltage Vcell of the battery cell C is less than the threshold voltage Vth2.

Meanwhile, for convenience of description, FIG. 1 shows a state in which the battery-monitoring device A is provided with two voltage comparison circuits 2A and 2B, but the number of voltage comparison circuits may be appropriately changed in accordance with the total number of battery cells C constituting the battery B (that is, in accordance with the number of groups of the battery cell C).

Figure 2:
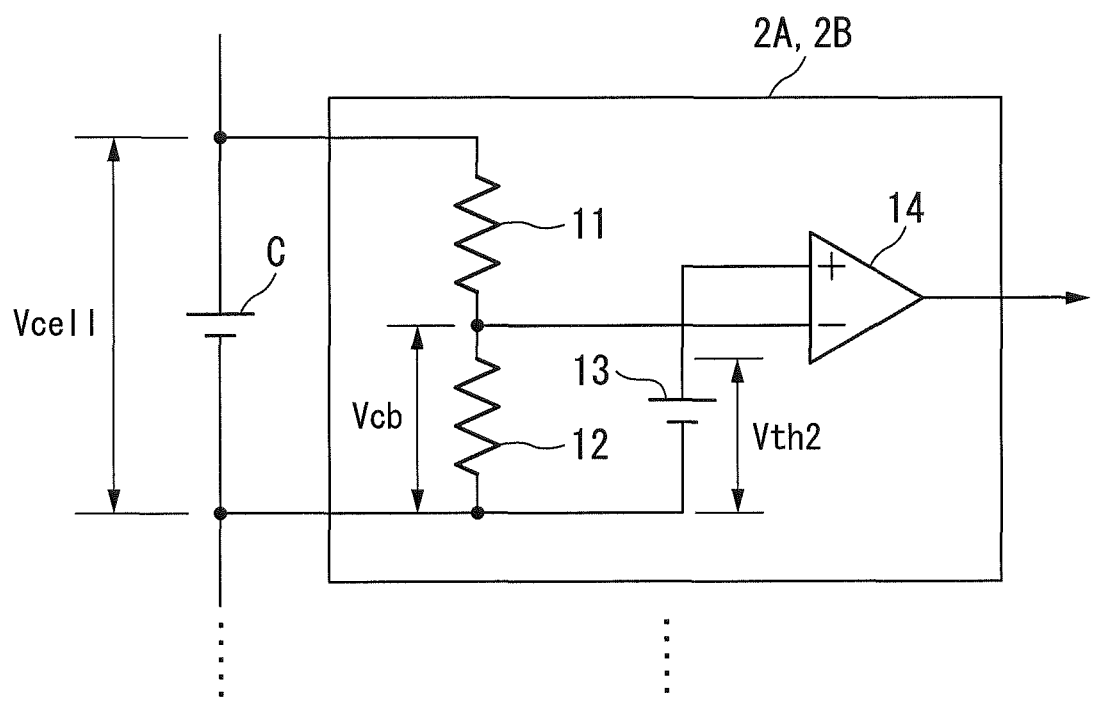
FIG. 2 is a specific circuit configuration example illustrating voltage comparison circuits 2A and 2B.

FIG. 2 shows a specific circuit configuration example illustrating the voltage comparison circuits 2A and 2B. As shown in the drawing, the voltage comparison circuits 2A and 2B include two voltage-dividing resistors 11 and 12, a threshold voltage source 13, and a comparator 14 with respect to one battery cell C.

The voltage-dividing resistor 11 is configured such that one end thereof is connected to a positive electrode terminal of the battery cell C, and the other end thereof is connected to one end of the voltage-dividing resistor 12 and an inverting input terminal of the comparator 14. The voltage-dividing resistor 12 is configured such that one end thereof is connected to the other end of the voltage-dividing resistor 11 and an inverting input terminal of the comparator 14, and the other end thereof is connected to a negative electrode terminal of the battery cell C and a negative electrode terminal of the threshold voltage source 13. The threshold voltage source 13 is a direct-current voltage source that generates the threshold voltage Vth2, and is configured such that a positive electrode terminal thereof is connected to a non-inverting input terminal of the comparator 14, and a negative electrode terminal thereof is connected to the other end of the voltage-dividing resistor 12 and a negative electrode terminal of the battery cell C.

The comparator 14 compares a voltage (voltage in which the voltage Vcell of the battery cell C is voltage-divided by the voltage-dividing resistors 11 and 12; hereinafter, called resistance voltage-dividing value Vcb) applied to the inverting input terminal with the voltage (threshold voltage Vth2) applied to the non-inverting input terminal, and outputs, to the CPU 3, a signal having a high level when the resistance voltage-dividing value Vcb is equal to or greater than the threshold voltage Vth2, and a signal having a low level when the resistance voltage-dividing value Vcb is less than the threshold voltage Vth2.

Meanwhile, for convenience of description, FIG. 2 shows a state in which one battery cell C is provided with the voltage-dividing resistors 11 and 12, the threshold voltage source 13, and the comparator 14, but in the voltage comparison circuits 2A and 2B, it should be noted that each of the battery cells C is provided with the voltage-dividing resistors 11 and 12, the threshold voltage source 13 and the comparator 14.

In addition, in the voltage comparison circuits 2A and 2B, a configuration may be adopted in which a set of the voltage-dividing resistors 11 and 12, the threshold voltage source 13 and the comparator 14 is provided, and each battery cell C is selectively connected to the voltage-dividing resistors 11 and 12 using a multiplexer.

Referring back to FIG. 1, the CPU 3 is a central processing unit that executes predetermined processes in accordance with a program stored in a nonvolatile memory (not shown). When at least one condition is satisfied from among two conditions of (1) the voltage detection value Vca of each battery cell C which is input from the voltage detection circuits 1A and 1B being equal to or greater than the threshold Vth1, and (2) a signal (output signal of the comparator 14) which is input from the voltage comparison circuits 2A and 2B being a high level, the CPU 3 determines that the battery cell C in which the condition is satisfied is in an overcharged state.

Next, operations of the battery-monitoring device A having the above-mentioned configuration will be described in detail.

Figure 3A:
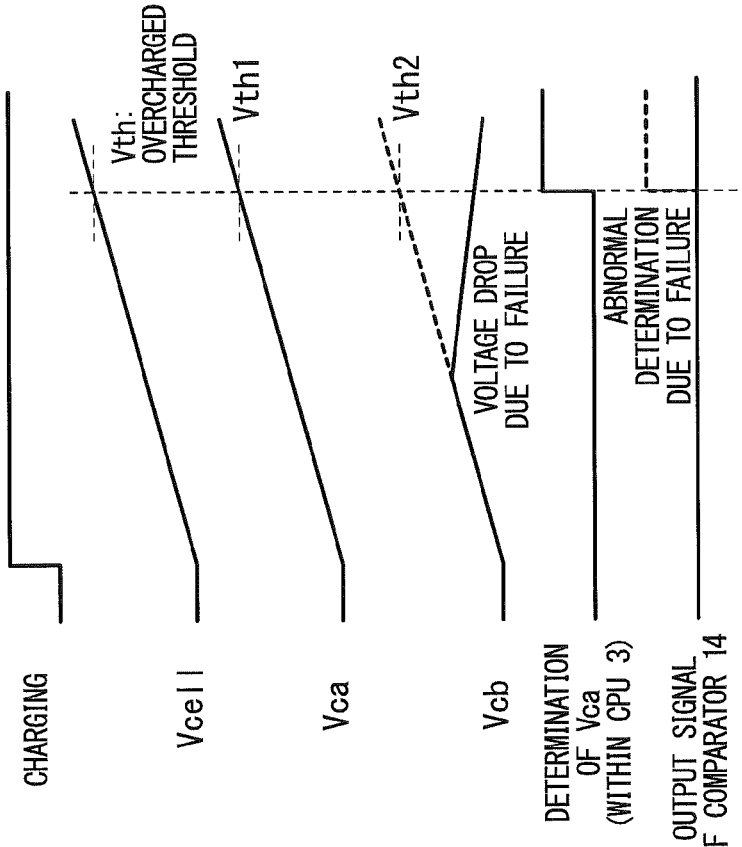
FIG. 3A is a first timing diagram illustrating operations of the battery-monitoring device A.

First, when focusing on one battery cell C belonging to the group G1, as in a first timing diagram shown in FIG. 3A, after the start of charging of the battery B, the voltage Vcell of the battery cell C, the voltage detection value Vca of the battery cell C detected by the voltage detection circuit 1A, and the resistance voltage-dividing value Vcb in the voltage comparison circuit 2A gradually increase at the same rate of change.

Here, when a failure is generated in the voltage detection circuit 1A, the resistance voltage-dividing value Vcb in the voltage comparison circuit 2A continuously increases with an increase in the voltage Vcell of the battery cell C, but the voltage detection value Vca of the battery cell C detected by the voltage detection circuit 1A starts to decrease gradually from a certain point in time.

In this case, at a point in time when the resistance voltage-dividing value Vcb becomes equal to or greater than the threshold voltage Vth2 (point in time when the voltage Vcell of the battery cell C becomes equal to or greater than an overcharged threshold Vth), the output signal of the voltage comparison circuit 2A (output signal of the comparator 14) is inverted from a low level to a high level. That is, when a failure is generated in the voltage detection circuit 1A, the CPU 3 cannot normally determine whether the voltage detection value Vca becomes equal to or greater than the threshold Vth1, but can determine whether the battery cell C is in an overcharged state by determining whether the output signal of the voltage comparison circuit 2A is at a high level.

Figure 3B:
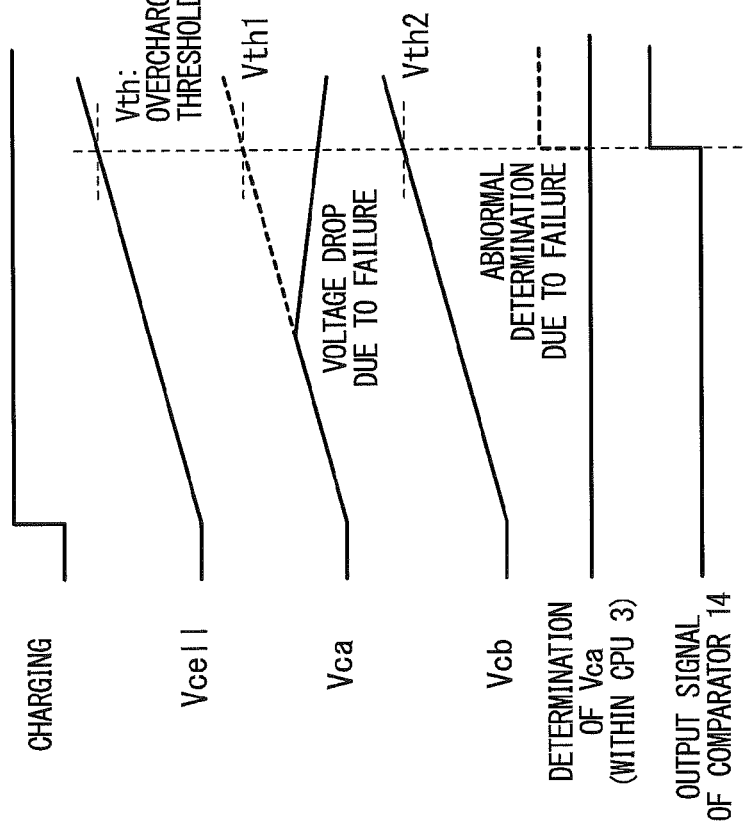
FIG. 3B is a second timing diagram illustrating operations of the battery-monitoring device A.

On the other hand, as in a second timing diagram shown in FIG. 3B, when a failure is generated in the voltage comparison circuit 2A, the voltage detection value Vca of the battery cell C detected by the voltage detection circuit 1A continuously increases with an increase in the voltage Vcell of the battery cell C, but the resistance voltage-dividing value Vcb in the voltage comparison circuit 2A starts to decrease gradually from a certain point in time.

In this case, since the output signal of the voltage comparison circuit 2A (output signal of the comparator 14) remains a low level, the CPU 3 cannot normally determine whether the output signal of the voltage comparison circuit 2A is at a high level. However, at a point in time when the voltage Vcell of the battery cell C becomes equal to or greater than the overcharged threshold Vth, the voltage detection value Vca of the battery cell C detected by the voltage detection circuit 1A also becomes equal to or greater than the threshold Vth1, and thus the CPU 3 can determine whether the battery cell C is in an overcharged state by determining whether the voltage detection value Vca becomes equal to or greater than the threshold Vth1.

Figure 4:
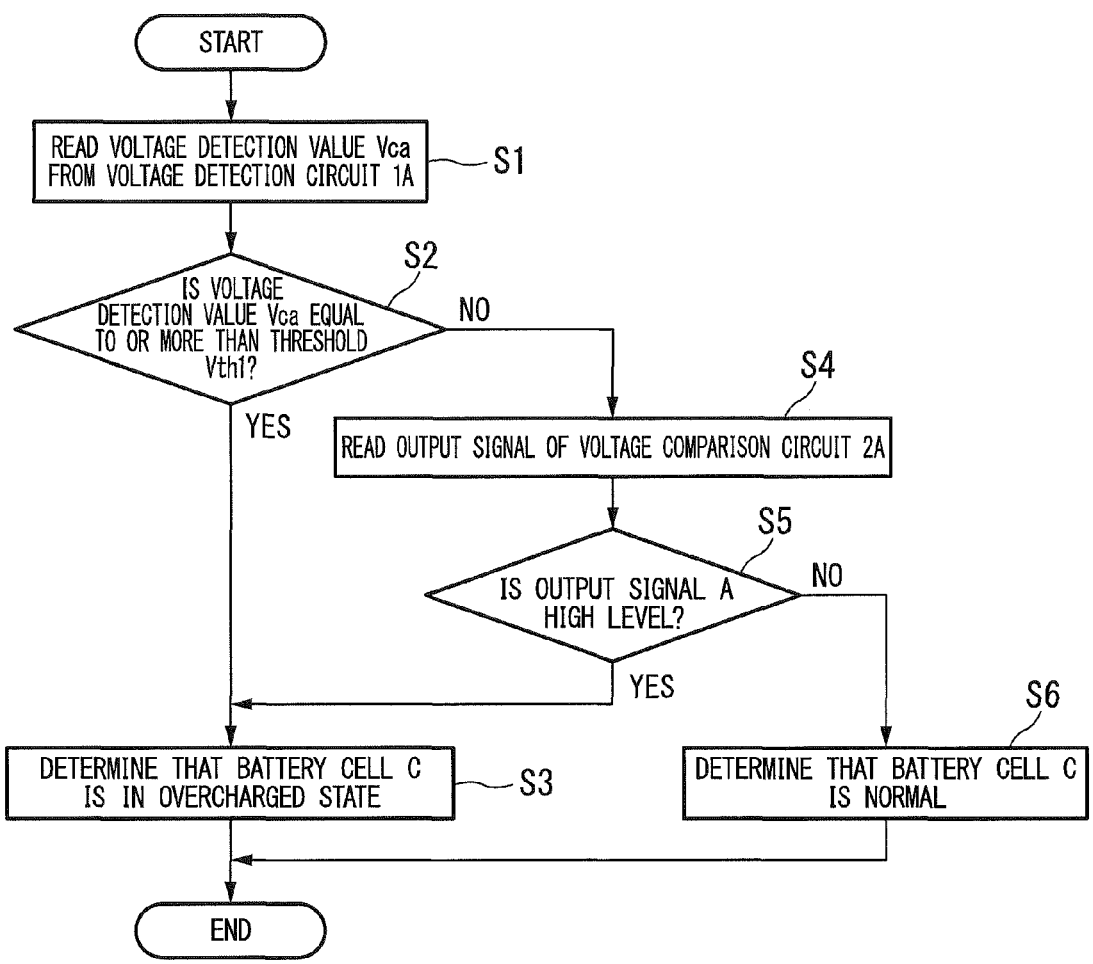
FIG. 4 is a flow diagram illustrating an overcharged determination process executed by a CPU 3.

Specifically, the CPU 3 determines whether the battery cell C is in an overcharged state by executing each process shown in a flow diagram of FIG. 4 at a constant sampling period. As shown in FIG. 4, when this sampling timing comes, the CPU 3 first reads the voltage detection value Vca of the battery cell C from the voltage detection circuit 1A (step S1), and determines whether the voltage detection value Vca is equal to or greater than the threshold Vth1 (step S2).

In the case of "Yes" in the above-mentioned step S2, since at least one condition is satisfied from among two conditions of (1) the voltage detection value Vca of the battery cell C being equal to or greater than the threshold Vth1, and (2) the signal (output signal of the comparator 14) which is input from the voltage comparison circuit 2A being a high level, the CPU 3 determines that the battery cell C in which the condition is satisfied is in an overcharged state (step S3).

On the other hand, in the case of "No" in the above-mentioned step S2, that is, the case where the voltage detection value Vca of the battery cell C is less than the threshold Vth1, the CPU 3 reads the output signal of the voltage comparison circuit 2A (step S4), and determines whether the output signal of the voltage comparison circuit 2A is at a high level (step S5).

In the case of "Yes" in the above-mentioned step S5, since at least one condition is satisfied from among the two conditions of (1) the voltage detection value Vca of the battery cell C being equal to or greater than the threshold Vth1, and (2) the signal (output signal of the comparator 14) which is input from the voltage comparison circuit 2A being a high level, the CPU 3 determines that the battery cell C in which the condition is satisfied is in an overcharged state (step S3).

On the other hand, in the case of "No" in the above-mentioned step S5, since both of the two conditions of (1) the voltage detection value Vca of the battery cell C being equal to or greater than the threshold Vth1, and (2) the signal (output signal of the comparator 14) which is input from the voltage comparison circuit 2A being a high level are not satisfied, the CPU 3 determines that the state of charge of the battery cell C is normal (step S6).

Meanwhile, the CPU 3 performs the processes of the above-mentioned steps S1 to S6 on the voltage detection circuit 1B and the voltage comparison circuit 2B in the same way.

As described above, in the present embodiment, even when a failure is generated in one of the voltage detection circuit 1A (1B) and the voltage comparison circuit 2A (2B), whether the battery cell C is in an overcharged state can be determined. Even when a dedicated IC chip is used as the voltage detection circuit 1A (1B), the voltage comparison circuit 2A (2B) can be realized by inexpensive components such as the comparator 14.

That is, according to the present embodiment, since the voltage detection circuit 1A (2A) is not required to be duplicated, unlike in the related art, it is possible to prevent overcharged cells due to circuit failure from failing to be noticed, while suppressing an increase in component costs, mounting space, and current consumption.

However, the invention is not limited to the above-mentioned embodiment, but includes the following modified examples.

(1) In the above-mentioned embodiment, the case in which only whether the battery cell C is in an overcharged state is determined is illustrated by way of example, but when the voltage detection value Vca which is input from the voltage detection circuit 1A (1B) is equal to or greater than the threshold Vth1, and the signal which is input from the voltage comparison circuit 2A (2B) is a low level, the CPU 3 may be provided with a function of determining that the battery cell C is in an overcharged state, and determining that the voltage comparison circuit 2A (2B) is out of order.

In addition, when the voltage detection value Vca which is input from the voltage detection circuit 1A (1B) is less than the threshold Vth1, and the signal which is input from the voltage comparison circuit 2A (2B) is at a high level, the CPU 3 may also be provided with a function of determining that the battery cell C is in an overcharged state, and determining that the voltage detection circuit 1A (1B) is out of order.

(2) In the above-mentioned embodiment, since the overcharged state of each battery cell C is determined on the basis of the voltage detection value Vca of the battery cell C obtained from the voltage detection circuit 1A (1B) for each sampling period, and the output signal of the voltage comparison circuit 2A (2B), the overcharged state cannot be determined earlier than the sampling period. Consequently, as a separate process from the process (process of confirming whether two conditions are satisfied) shown in FIG. 4, the CPU 3 may be provided with a function of determining the output signal of the voltage comparison circuit 2A (2B) is at a high level, and determining the overcharged state using only the determination result. Thereby, it is possible to determine the overcharged state earlier than the sampling period.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A battery-monitoring device that monitors a state of charge of each battery cell constituting a battery, comprising:
   a voltage detection circuit that individually detects a voltage of the battery cell, and outputs a voltage detection value which is a digital signal indicating a detection result of the voltage of the battery cell;
   a voltage comparison circuit that individually compares the voltage of the battery cell and a threshold voltage, and outputs a signal having a first level when the voltage of the battery cell is equal to or greater than the threshold voltage, and a signal having a second level when the voltage of the battery cell is less than the threshold voltage; and
   a determination unit that determines the overcharged state of the battery cell when at least one condition is satisfied from among two conditions of: the voltage detection value which is input from the voltage detection circuit being equal to or greater than a threshold; and a signal which is input from the voltage comparison circuit being a first level;

wherein when the voltage detection value which is input from the voltage detection circuit is equal to or greater than the threshold, and the signal which is input from the voltage comparison circuit is the second level, the determination unit determines that the battery cell is in the overcharged state, and determines that the voltage comparison circuit is out of order, and when the voltage detection value which is input from the voltage detection circuit is less than the threshold, and the signal which is input from the voltage comparison circuit is the first level, the determination unit determines that the battery cell is in the overcharged state, and determines that the voltage detection circuit is out of order.

2. The battery-monitoring device according to claim 1, wherein as a separate process of confirming whether each of the two conditions is satisfied, the determination unit determines whether the battery cell is in an overcharged state by determining only whether the signal which is input from the voltage comparison circuit is the first level.

* * * * *